United States Patent
Bruce et al.

(10) Patent No.: US 9,099,187 B2
(45) Date of Patent: Aug. 4, 2015

(54) REDUCING ERASE CYCLES IN AN ELECTRONIC STORAGE DEVICE THAT USES AT LEAST ONE ERASE-LIMITED MEMORY DEVICE

(71) Applicant: BiTMICRO Networks, Inc., Fremont, CA (US)

(72) Inventors: Rolando H. Bruce, South San Francisco, CA (US); Reyjan C. Lanuza, Imus Cavite (PH); Jose Miguel N. Lukban, Penang (MY); Mark Ian A. Arcedera, Pranaque (PH); Ryan C. Chong, Quezon (PH)

(73) Assignee: BiTMICRO Networks, Inc., Fremont, CA (US)

( * ) Notice: Subject to any disclaimer, the term of this patent is extended or adjusted under 35 U.S.C. 154(b) by 0 days.

(21) Appl. No.: 14/038,684

(22) Filed: Sep. 26, 2013

(65) Prior Publication Data

US 2014/0104949 A1    Apr. 17, 2014

Related U.S. Application Data

(63) Continuation of application No. 12/882,059, filed on Sep. 14, 2010, now Pat. No. 8,560,804.

(60) Provisional application No. 61/242,364, filed on Sep. 14, 2009.

(51) Int. Cl.
G06F 12/02    (2006.01)
G11C 16/16    (2006.01)
G06F 3/06    (2006.01)

(52) U.S. Cl.
CPC ............ *G11C 16/16* (2013.01); *G06F 12/0246* (2013.01); *G06F 3/0679* (2013.01)

(58) Field of Classification Search
CPC .... G06F 3/0679; G06F 12/0246; G11C 16/16
USPC .................. 711/202, 103, 156, 158, 165, 170
See application file for complete search history.

(56) References Cited

U.S. PATENT DOCUMENTS

| | | |
|---|---|---|
| 4,752,871 A | 6/1988 | Sparks |
| RE34,100 E | 10/1992 | Hartness |
| 5,222,046 A | 6/1993 | Kreifels et al. |
| 5,297,148 A | 3/1994 | Harari et al. |
| 5,341,339 A | 8/1994 | Wells |
| 5,371,709 A | 12/1994 | Fisher et al. |
| 5,379,401 A | 1/1995 | Robinson et al. |

(Continued)

FOREIGN PATENT DOCUMENTS

| | | |
|---|---|---|
| EP | 0 458 510 | 11/1991 |
| JP | 2005-309847 | 11/2005 |
| WO | WO 94/06210 | 3/1994 |

OTHER PUBLICATIONS

Security Comes to SNMP: The New SNMPv3 Proposed Internet Standard, The Internet Protocol Journal, vol. 1, No. 3, Dec. 1998.

(Continued)

*Primary Examiner* — Stephen Elmore
(74) *Attorney, Agent, or Firm* — Stephen Uriarte

(57) ABSTRACT

A solution for reducing erase cycles in an electronic storage device that uses at least one erase-limited memory device is disclosed.

24 Claims, 9 Drawing Sheets

(56) References Cited

U.S. PATENT DOCUMENTS

| | | | |
|---|---|---|---|
| 5,388,083 A | 2/1995 | Assar et al. | |
| 5,396,468 A | 3/1995 | Harari et al. | |
| 5,406,529 A | 4/1995 | Asano | |
| 5,432,748 A | 7/1995 | Hsu et al. | |
| 5,448,577 A | 9/1995 | Wells et al. | |
| 5,459,850 A | 10/1995 | Clay et al. | |
| 5,479,638 A | 12/1995 | Assar et al. | |
| 5,485,595 A | 1/1996 | Assar et al. | |
| 5,488,711 A | 1/1996 | Hewitt et al. | |
| 5,500,826 A | 3/1996 | Hsu et al. | |
| 5,509,134 A | 4/1996 | Fandrich et al. | |
| 5,513,138 A | 4/1996 | Manabe et al. | |
| 5,524,231 A | 6/1996 | Brown | |
| 5,530,828 A | 6/1996 | Kaki et al. | |
| 5,535,328 A | 7/1996 | Harari et al. | |
| 5,535,356 A | 7/1996 | Kim et al. | |
| 5,542,042 A | 7/1996 | Manson | |
| 5,542,082 A | 7/1996 | Solhjell | |
| 5,548,741 A | 8/1996 | Watanabe | |
| 5,559,956 A | 9/1996 | Sukegawa | |
| 5,568,423 A | 10/1996 | Jou et al. | |
| 5,568,439 A | 10/1996 | Harari | |
| 5,572,466 A | 11/1996 | Sukegawa | |
| 5,594,883 A | 1/1997 | Pricer | |
| 5,602,987 A | 2/1997 | Harari et al. | |
| 5,603,001 A | 2/1997 | Sukegawa et al. | |
| 5,606,529 A | 2/1997 | Honma et al. | |
| 5,606,532 A | 2/1997 | Lambrache et al. | |
| 5,619,470 A | 4/1997 | Fukumoto | |
| 5,627,783 A | 5/1997 | Miyauchi | |
| 5,640,349 A | 6/1997 | Kakinuma et al. | |
| 5,644,784 A * | 7/1997 | Peek | 710/24 |
| 5,737,742 A | 4/1998 | Achiwa et al. | |
| 5,796,182 A | 8/1998 | Martin | |
| 5,799,200 A | 8/1998 | Brant et al. | |
| 5,802,554 A | 9/1998 | Caceres et al. | |
| 5,819,307 A | 10/1998 | Iwamoto et al. | |
| 5,822,251 A * | 10/1998 | Bruce et al. | 365/185.33 |
| 5,875,351 A * | 2/1999 | Riley | 710/22 |
| 5,881,264 A * | 3/1999 | Kurosawa | 712/217 |
| 5,913,215 A * | 6/1999 | Rubinstein et al. | 707/708 |
| 5,918,033 A * | 6/1999 | Heeb et al. | 712/217 |
| 5,943,421 A * | 8/1999 | Grabon | 380/269 |
| 6,000,006 A * | 12/1999 | Bruce et al. | 711/103 |
| 6,076,137 A | 6/2000 | Asnaashari | |
| 6,215,875 B1 * | 4/2001 | Nohda | 380/202 |
| 6,230,269 B1 * | 5/2001 | Spies et al. | 713/182 |
| 6,298,071 B1 * | 10/2001 | Taylor et al. | 370/486 |
| 6,317,330 B1 | 11/2001 | Portman et al. | |
| 6,363,441 B1 * | 3/2002 | Bentz et al. | 710/58 |
| 6,363,444 B1 * | 3/2002 | Platko et al. | 710/110 |
| 6,404,772 B1 * | 6/2002 | Beach et al. | 370/443 |
| 6,526,506 B1 * | 2/2003 | Lewis | 713/153 |
| 6,529,416 B2 * | 3/2003 | Bruce et al. | 365/185.33 |
| 6,557,095 B1 * | 4/2003 | Henstrom | 712/216 |
| 6,757,845 B2 | 6/2004 | Bruce | |
| 6,857,076 B1 * | 2/2005 | Klein | 713/189 |
| 6,901,499 B2 * | 5/2005 | Aasheim et al. | 711/205 |
| 6,961,805 B2 * | 11/2005 | Lakhani et al. | 711/5 |
| 6,970,446 B2 * | 11/2005 | Krischer et al. | 370/338 |
| 6,970,890 B1 | 11/2005 | Bruce et al. | |
| 6,980,795 B1 * | 12/2005 | Hermann et al. | 455/410 |
| 7,103,684 B2 * | 9/2006 | Chen et al. | 710/62 |
| 7,174,438 B2 * | 2/2007 | Homma et al. | 711/161 |
| 7,194,766 B2 * | 3/2007 | Noehring et al. | 726/13 |
| 7,263,006 B2 * | 8/2007 | Aritome | 365/185.29 |
| 7,283,629 B2 * | 10/2007 | Kaler et al. | 380/44 |
| 7,305,548 B2 * | 12/2007 | Pierce et al. | 713/155 |
| 7,330,954 B2 * | 2/2008 | Nangle | 711/170 |
| 7,372,962 B2 * | 5/2008 | Fujimoto et al. | 380/255 |
| 7,500,063 B2 * | 3/2009 | Zohar et al. | 711/137 |
| 7,506,098 B2 | 3/2009 | Arcedera et al. | |
| 7,613,876 B2 | 11/2009 | Bruce et al. | |
| 7,620,748 B1 * | 11/2009 | Bruce et al. | 710/22 |
| 7,624,239 B2 * | 11/2009 | Bennett et al. | 711/159 |
| 7,660,941 B2 * | 2/2010 | Lee et al. | 711/103 |
| 7,716,389 B1 * | 5/2010 | Bruce et al. | 710/22 |
| 7,729,370 B1 | 6/2010 | Orcine et al. | |
| 7,743,202 B2 * | 6/2010 | Tsai et al. | 711/103 |
| 7,765,359 B2 * | 7/2010 | Kang et al. | 711/103 |
| 7,826,243 B2 | 11/2010 | Bruce et al. | |
| 7,934,052 B2 * | 4/2011 | Prins et al. | 711/103 |
| 8,010,740 B2 | 8/2011 | Bruce et al. | |
| 8,032,700 B2 | 10/2011 | Bruce et al. | |
| 8,093,103 B2 | 1/2012 | Bruce et al. | |
| 8,165,301 B1 | 4/2012 | Bruce et al. | |
| 8,200,879 B1 * | 6/2012 | Falik et al. | 710/307 |
| 8,375,257 B2 | 2/2013 | Hong et al. | |
| 8,447,908 B2 | 5/2013 | Bruce et al. | |
| 8,510,631 B2 | 8/2013 | Wu et al. | |
| 8,560,804 B2 | 10/2013 | Bruce et al. | |
| 8,707,134 B2 | 4/2014 | Takahashi et al. | |
| 8,713,417 B2 | 4/2014 | Jo | |
| 8,788,725 B2 | 7/2014 | Bruce et al. | |
| 8,959,307 B1 | 2/2015 | Bruce et al. | |
| 2001/0010066 A1 * | 7/2001 | Chin et al. | 711/108 |
| 2002/0073324 A1 * | 6/2002 | Hsu et al. | 713/189 |
| 2002/0083262 A1 * | 6/2002 | Fukuzumi | 711/103 |
| 2002/0141244 A1 * | 10/2002 | Bruce et al. | 365/185.33 |
| 2003/0163624 A1 | 8/2003 | Matsui et al. | |
| 2003/0182576 A1 * | 9/2003 | Morlang et al. | 713/201 |
| 2003/0204675 A1 * | 10/2003 | Dover et al. | 711/137 |
| 2003/0223585 A1 * | 12/2003 | Tardo et al. | 380/277 |
| 2004/0128553 A1 * | 7/2004 | Buer et al. | 713/201 |
| 2006/0095709 A1 | 5/2006 | Achiwa | |
| 2006/0184723 A1 * | 8/2006 | Sinclair et al. | 711/103 |
| 2007/0019573 A1 * | 1/2007 | Nishimura | 370/279 |
| 2007/0028040 A1 | 2/2007 | Sinclair | |
| 2007/0083680 A1 * | 4/2007 | King et al. | 710/22 |
| 2007/0130439 A1 * | 6/2007 | Andersson et al. | 711/200 |
| 2007/0174493 A1 * | 7/2007 | Irish et al. | 710/5 |
| 2007/0174506 A1 * | 7/2007 | Tsuruta | 710/22 |
| 2007/0195957 A1 * | 8/2007 | Arulambalam et al. | 380/277 |
| 2009/0094411 A1 * | 4/2009 | Que | 711/103 |
| 2009/0158085 A1 | 6/2009 | Kern et al. | |
| 2009/0172250 A1 | 7/2009 | Allen et al. | |
| 2009/0172466 A1 | 7/2009 | Royer et al. | |
| 2011/0113186 A1 | 5/2011 | Bruce et al. | |
| 2011/0161568 A1 | 6/2011 | Bruce et al. | |
| 2011/0167204 A1 | 7/2011 | Estakhri et al. | |
| 2011/0202709 A1 * | 8/2011 | Rychlik | 711/103 |
| 2011/0264884 A1 | 10/2011 | Kim | |
| 2013/0246694 A1 | 9/2013 | Bruce et al. | |

OTHER PUBLICATIONS

Office Action for U.S. Appl. No. 12/270,626 mailed on Mar. 15, 2013.

Notice of Allowance/Allowability for U.S. Appl. No. 12/270,626 mailed on Oct. 3, 2014.

Advisory Action for U.S. Appl. No. 12/876,113 mailed on Oct. 16, 2014.

Office Action for U.S. Appl. No. 13/475,878 mailed on Dec. 4, 2014.
Office Action for U.S. Appl. No. 13/253,912 mailed on Jan. 29, 2015.
Office Action for U.S. Appl. No. 13/253,912 mailed on Jul. 16, 2014.
Office Action for U.S. Appl. No. 12/876,113 mailed on Dec. 5, 2014.
Office Action for U.S. Appl. No. 12/270,626 mailed on Feb. 3, 2012.
Office Action for U.S. Appl. No. 12/270,626 mailed on Apr. 4, 2011.
Office Action for U.S. Appl. No. 13/475,878 mailed on Jun. 23, 2014.
Office Action for U.S. Appl. No. 12/876,113 mailed on Jul. 11, 2014.
Office Action for U.S. Appl. No. 12/876,113 mailed on Oct. 16, 2014.
Notice of Allowance for U.S. Appl. No. 12/270,626 mailed Oct. 3, 2014.

Office Action for U.S. Appl. No. 12/270,626 mailed on May 23, 2014.
Office Action for U.S. Appl. No. 12/270,626 mailed on Dec. 18, 2013.

Office Action for U.S. Appl. No. 12/270,626 mailed on Aug. 23, 2012.

Office Action for U.S. Appl. No. 12/876,113 mailed on Mar. 13, 2014.

Advisory Action for U.S. Appl. No. 12/876,113 mailed on Sep. 6, 2013.

(56) References Cited

OTHER PUBLICATIONS

Office Action for U.S. Appl. No. 12/876,113 mailed on May 14, 2013.
Office Action for U.S. Appl. No. 12/876,113 mailed on Dec. 21, 2012.
Security Comes to SNMP: The New SNMPv3 Proposed Internet Standard, The Internet Protocol Journal, vol. 1, No. 3, Decemebr 1998.
Notice of Allowability for U.S. Appl. No. 12/882,059 mailed on May 30, 2013.
Notice of Allowability for U.S. Appl. No. 12/882,059 mailed on Feb. 14, 2013.
Office Action for U.S. Appl. No. 12/882,059 mailed on May 11, 2012.
Office Action for U.S. Appl. No. 13/475,878, mailed on Jun. 23, 2014.
Notice of Allowability for U.S. Appl. No. 13/890,229 mailed on Feb. 20, 2014.
Office Action for U.S. Appl. No. 13/890,229 mailed on Oct. 8, 2013.
USPTO Notice of Allowability & attachment(s) mailed Jan. 7, 2013 for U.S. Appl. No. 12/876,247.
Office Action mailed Sep. 14, 2012 for U.S. Appl. No. 12/876,247.
Office Action mailed Feb. 1, 2012 for U.S. Appl. No. 12/876,247.

* cited by examiner

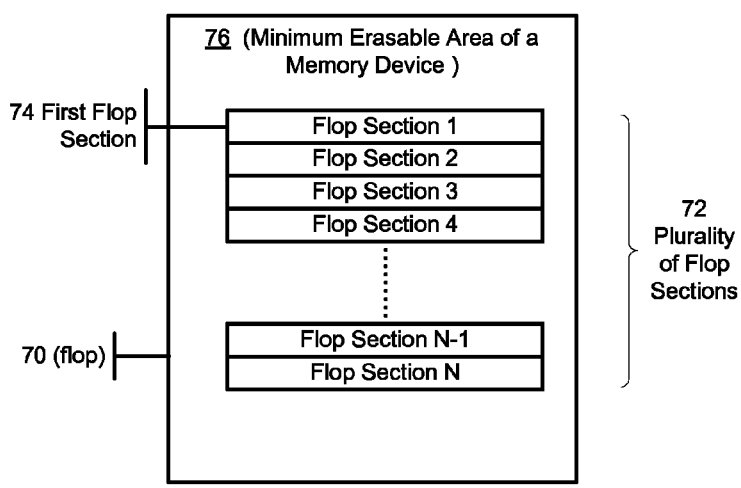

Flop Status after Flop Initialization

Flop Status During First Write Performed on Flop after Initialization

Flop Status after First Write Performed on Flop after Initialization

Flop Status after Second Write Performed on Flop after Initialization

Method for Initializing a Flop

Method For Performing a Flop Write

Read Method

Multilevel Mapping Structure

REDUCING ERASE CYCLES IN AN ELECTRONIC STORAGE DEVICE THAT USES AT LEAST ONE ERASE-LIMITED MEMORY DEVICE

CROSS-REFERENCE(S) TO RELATED APPLICATIONS

This application is a continuation applications of United States Application, entitled "Reducing Erase Cycles In An Electronic Storage Device That Uses At Least One Erase-Limited Memory Device", having a filing date of 14 Sep. 2010 and Ser. No. 12/882,059, which claims the benefit of and a priority to United Stated Provisional Application, entitled "Reducing Erase Cycles In An Electronic Storage Device That Uses At Least One Erase-Limited Memory Device", having filing date of 14 Sep. 2009 and Ser. No. 61/242,364, application Ser. Nos. 12/882,059 and 61/242,364 are hereby fully incorporated herein by reference.

FIELD OF THE INVENTION

The present invention relates to solutions for reducing erase cycles. More particularly, the present invention pertains to solutions for reducing erase cycles in an electronic storage device that uses at least one erase-limited memory device, such as NAND (Not And) flash memory devices.

BACKGROUND

Electronic storage devices that respectively employ a memory subsystem that includes memory devices or modules that use non-volatile memory cells are commonly known and are sometimes referred to as solid-state storage devices. The computer device industry has increased the adoption of these solid-state storage devices due to certain advantages offered by these types of storage devices over other forms of storage devices, such as rotational drives. The adoption of solid state storage devices as enhancement or even a replacement to rotational drives is not without some difficulty because many conventional computer devices, sometimes referred to as "hosts", use host operating systems, file systems, or both that are optimized for use with rotational drives rather than solid state storage devices. For example, unlike rotational drives, solid state storage devices that use NAND flash memory devices, also referred to as "flash drives", suffer from write limitations because these devices require an erase cycle before a write cycle can be performed on or within a flash block of a flash memory device. Currently, flash block can only support a limited number of erase cycles and after an approximate number of these erase cycles are performed on a flash block, the flash block will eventually be unable to store data in the flash block in a reliable manner. For instance, data stored in a flash block that is at or near its erase cycle limit may start exhibiting bit errors which will progressively increase in size until this data can no longer be reliably read from the flash block.

To reduce erase cycles, one traditional solution is to use wear-leveling but this does not actually reduce or minimize erase cycles. Instead, wear-leveling simply spreads out erase cycles by re-mapping writes from one flash block to another flash block. Another solution is to employ a write-in-place technique but this suffers from the disadvantage of increasing erase-cycles in embodiments that use control blocks.

Consequently, a need exists for reducing erase cycles in electronic storage devices, such as solid-state storage devices, that use erase-limited memory devices.

SUMMARY

A solution for reducing erase cycles in an electronic storage device that uses at least one erase-limited memory device is disclosed.

BRIEF DESCRIPTION OF DRAWINGS

FIG. 2 is a mapping table for an electronic storage device, such as the electronic storage device illustrated in FIG. 1, in accordance with another embodiment of the present invention;

FIG. 3 illustrates flash blocks, such as the flash blocks used in FIGS. 1 and 2, or both, that have been initialized to include flop sections in accordance with another embodiment of the present invention;

DETAILED DESCRIPTION OF THE INVENTION

In the following detailed description, for purposes of explanation, numerous specific details are set forth to provide a thorough understanding of the various embodiments of the present invention. Those of ordinary skill in the art will realize that these various embodiments of the present invention are illustrative only and are not intended to be limiting in any way. Other embodiments of the present invention will readily suggest themselves to such skilled persons having the benefit of this disclosure.

In addition, for clarity purposes, not all of the routine features of the embodiments described herein are shown or described. One of ordinary skill in the art would readily appreciate that in the development of any such actual implementation, numerous implementation-specific decisions may be required to achieve specific design objectives. These design objectives will vary from one implementation to another and from one developer to another. Moreover, it will be appreciated that such a development effort might be complex and time-consuming but would nevertheless be a routine engineering undertaking for those of ordinary skill in the art having the benefit of this disclosure.

The various embodiments disclosed herein are not intended to limit the scope and spirit of the herein disclosure. For example, the present invention may be used to enhance the basic architecture of existing storage solutions and devices that use semiconductor memory devices, such as flash memory, including the device disclosed in U.S. Pat. No. 5,822,251,entitled "Expandable Flash-Memory Mass-Storage Using Shared Buddy Lines and Intermediate Flash-Bus Between Device-Specific Buffers and Flash-Intelligent DMA controllers", issued on Oct. 13, 1998, hereinafter named the "Patent", and which is hereby incorporated by reference as if fully set forth herein.

Figure 1:
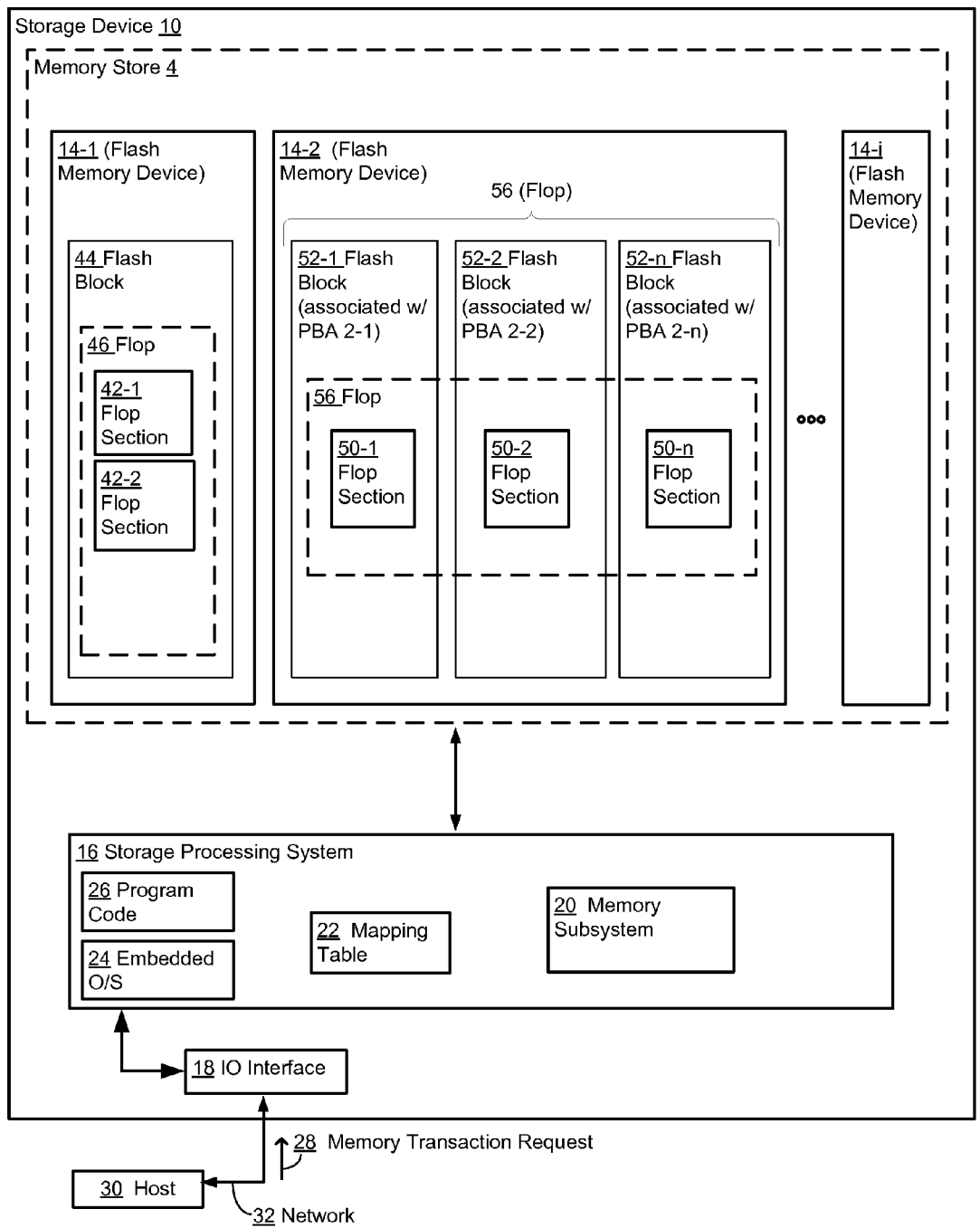
FIG. 1 is a block diagram of an electronic storage device that reduces the number of erase-cycles that would otherwise be performed on a memory store which includes at least one erase-limited memory device in accordance with one embodiment of the present invention.

With reference to FIG. 1, the present invention reduces erase cycles in an electronic storage device 10 that uses at least one erase-limited memory device. An erase-limited memory device is any memory device that can only support a limited number of write cycles before exhibiting bit errors. These bit errors will progressively increase in size until data can no longer be reliably read from the memory device. For instance, an erase-limited memory device may be a NAND flash memory devices. A NAND flash memory device is a erase-limited memory device because a NAND flash memory device requires an erase-cycle on a flash block before the flash block may be used to receive a write operation, and the number of erase-cycles that a flash block can support is limited. Once the flash block nears or exceeds this erase cycle limit, data may no longer be written or read from the flash block reliably without some sort of intervention, such as data correction. Eventually, even with data correction, the data stored in the flash block may have too many bit errors that can be adequately corrected, rendering the flash block unusable for its intended purpose.

The term "flash memory device" is intended to include any form of non-volatile solid-state memory, including those that use blocks of non-volatile memory cells, named flash blocks. Each memory cell (not shown) may be single or multi-level. Flash memory devices are known by those of ordinary skill in the art. A flash memory device permits memory operations, such as a write or read operation, to be performed on these flash blocks according to a protocol supported by the flash memory device. A flash memory device may be implemented by using a NAND flash memory device that complies with the Open NAND Flash Interface Specification, commonly referred to as ONFI Specification. The term "ONFI Specification" is a known device interface standard created by a consortium of technology companies, called the "ONFI Workgroup". The ONFI Workgroup develops open standards for NAND flash memory devices and for devices that communicate with these NAND flash memory devices. The ONFI Workgroup is headquartered in Hillsboro, Oreg. Using a flash memory device that complies with the ONFI Specification is not intended to limit the embodiment disclosed. One of ordinary skill in the art having the benefit of this disclosure would readily recognize that other types of flash memory devices employing different device interface protocols may be used, such as protocols compatible with the standards created through the Non-Volatile Memory Host Controller Interface ("NVMHCI") working group. Members of the NVMHCI working group include Intel Corporation of Santa Clara, Calif., Dell Inc. of Round Rock, Tex. and Microsoft Corporation of Redmond, Wash.

In FIG. 1, electronic storage device 10 may have any configuration that can perform memory operations on a memory store 4, which includes at least one erase-limited memory device, such as flash memory devices 14-1, 14-2, through 14-i; and that reduces erase-cycles according to the present invention. The variable i reflects the maximum number of flash memory devices that form a portion or all of memory store 4. Electronic storage device 10 may be configured to include a storage processing unit 16 that is coupled to memory store 4 and an I/O (input/output) interface 18. IO interface 18 may be in the form of a SATA (Serial Advanced Technology Attachment), iSCSI (Internet Small Computer System Interface), Fibre Channel, USB (Universal Serial Bus), eSATA (external SATA) interfaces, a network adapter, a PCI (Peripheral Component Interconnect) or PCI-e (PCI Express) bus bridge, or the like. Storage processing unit 18 may include subcomponents, such as a CPU (central processing unit), interconnecting pathways, such as busses and control lines, (collectively referred to as "interconnects"), and a working memory, such as DRAM (dynamic random acess memory), which are not illustrated to avoid overcomplicating this disclosure. Storage processing system may also include a memory subsystem 20, a mapping table 22, an embedded operating system, named "OS" 24, and a program code 26. Memory subsystem 20 may include DMA (direct memory access) controllers and interconnects that couple memory subsystem 20 between storage processing system 16 to memory store 4. These device components enable electronic storage device 10 to execute an embedded operating system, such as OS (operating system) 24, that is necessary for processing memory transaction requests, including memory transaction request 28, which are initiated by one or more hosts, including host 30, through a suitable conduit, such as network 32.

Storage processing system 16 uses at least one logical storage unit, named a "flop", when minimizing erase cycles. A flop includes a set of at least two flop sections from one or more minimum erasable locations that are from at least one erase-limited memory device, such as flash block 44 in flash memory device 14-1 and flash blocks 52-1 through 52-n in flash memory device 14-2, respectively. The variable n reflects the maximum number of flash blocks disposed in flash memory device 14-2. In addition, storage processing system 16 maps these flash blocks to a single primary address, such as a LBA (logical block address) address used by host 30. For example, flash memory device 14-1 may be used to include at least two flop sections 42-1 and 42-2, which are created from a single flash block 44 in flash memory device 14-1. Flash block 44 is mapped to a single primary address 62-1, and may thus also be referred to as a flop, such as flop 46. Thus in this example, flop sections are formed from a single flash block. When used to form a flop, each of these mapped flash blocks may be also referred as flop blocks. Using this naming convention in FIG. 1, flop sections 42-1 through 42-2 collectively belong to flop 46.

In another example, flash memory device 14-2 may be initialized to in include at least two flop sections, such as 50-1 through 50-n,but unlike in the previous example, flop sections 50-1 through 50-n are created from n number of flash blocks, such as flash blocks 52-1 through 52-n in flash memory device 14-2. Flash blocks 52-1 through 52-n are mapped to a single primary address, and thus may be also referred to as a flop, such as flop 56. In this example, n number of flash sections are formed from n number of flash blocks. These examples are not intended to limit the embodiment shown in FIG. 1. Other variations may be used. In another example (not shown), flop sections may be formed from flash blocks that are from different flash memory devices.

A primary address may be any address, such as an LBA, that is associated by a host to data which is subject to a memory transaction request, such as memory transaction request 28 in FIG. 1. An LBA represents an address that is part of a logical addressing system (not shown) used by a host 30, and this host may use one or more LBAs in a memory transaction request, such as memory transaction request 28. Other types of primary addresses may be mapped other than an LBA, including any address that is part of a memory device addressing system used by electronic storage device 10 but is in logical form. The mapping of a primary address to a set of at least one flop blocks may be performed by using a mapping structure, such as mapping table 22. The form of the mapping structure used to provide the association between a single primary address to a set of flop blocks is not intended to limit the present invention in any way, and any form for the mapping structure may be utilized In FIG. 2, mapping table 22 is illustrated in accordance with another embodiment of the present invention. Mapping table 22 includes a set of at least one primary address, such as addresses 62-1, 62-2, and 62-k. Mapping table 22 associates LBAs used by a host to the memory device addressing system used by an electronic storage device. This primary address to flop block mapping is named "flop mapping". Flop mapping is used as part of minimizing erase-cycles in selected erase-limited memory devices in memory store 4. Mapping table 22 is not limited to mapping all primary addresses supported by electronic storage device 10 to a flop or to using all minimum erasable locations available in memory store 4.

Primary addresses, such as addresses 62-1, 62-2, and 62-k, that are mapped to a flop block are subject to reduced erase-cycles. For example, address 62-1, which is in the form of an LBA, named LBA1, is mapped to a set of at least one flash block addresses respectively corresponding to a set of at least one flash blocks, such as PBA (physical block address) 1-1 and flash block 44. Similarly, address 622, which is in the form of an LBA, named LBA2, is mapped to a set of at least one flash block addresses respectively corresponding to a set of at least one flash blocks, such as PBA 2-1 through PBA 2-n and flash blocks 52-1 through 52-n,respectively. Further, address 62-k, which is in the form of an LBA, named LBAK, is mapped to a set of at least one flash block addresses respectively corresponding to a set of at least one flash blocks 68-1 through 68-M. These flash block addresses are associated with or have physical block addresses PBA M-1, PBA M-2, PBA M-N, and may be also referred to as flop L. Mapping a host address, such as an LBA, to a set of flash blocks that represent a flop is not intended to limit the present in anyway. Variable k, L, M, and N reflect a variable integer number and are not intended to limit the present invention in any way.

In accordance with yet another embodiment of the present invention, the data associated with the primary address associated with a flop, such as primary address 62-2 and flop 56 in FIG. 2, respectively, has a data size that is at most equal to the size of the flop section, named "flop section size", initialized from the flop block of flop 56. For instance, if a flop section is initialized using pages from a flash block then the data associated with the primary address is limited to be at most equal to the page size of the flash block.

Minimum Erasable Location

FIG. 3 illustrates a generic illustration of a flop 70 that has been initialized to include a plurality of flop sections 72, including a first flop section 74, in accordance with another embodiment of the present invention. Flop sections 72 may be formed from a minimum erasable location 76 of a memory device. For example, if the memory device used is a flash memory device, such as 14-1 in FIG. 1, flop sections 70 would be formed from a flash block from this flash memory device since a flash block is the minimum erasable location of a (NAND) flash memory device. A minimum erasable location, such as 76, may also be referred to in the alternative as a "flop block". Flop 70 can have more than one flop section that contains data but only one of these flop sections will be considered to hold valid data.

In addition, this minimum erasable location is partitioned into at least one flop section, such as flop sections 72. In accordance with one embodiment of the present invention, a flop section, such as first flop section 74, represents a minimum writeable area selected for minimum erasable location 76 for the memory device. For example, if the memory device used is a flash memory device, such as 14-1 in FIG. 1, each flop section from plurality of flop sections 72, such as first flop section 74, would be formed from a selected minimum writable area of flash block 44. A flash block has at least two native minimum writable areas that can be used: a flash block page, named herein as a "page", or a flash block partial page, named herein as a "partial page". In the embodiment disclosed in FIG. 3, a minimum writeable area is in the form of a page although this is not intended to limit the present invention in any way. Partial pages can be used as flop sections, or other minimum writable areas can be selected that are not native to the flash block. For instance, using additional program logic, a flop section can be comprised of two pages.

The minimum erasable location may be partitioned to have at minimum one flop section although a flop, such as flop 46, flop 56, or flop L in FIG. 2, should have at least two flop sections to provide a reduction in erase cycles in the memory device(s) associated with the flop. For instance in FIG. 4, one or more flop blocks, such as flop blocks 90-1 through 90-n, can be grouped together to form a flop 92.

Method of Initializing Flop Sections

Figure 6:
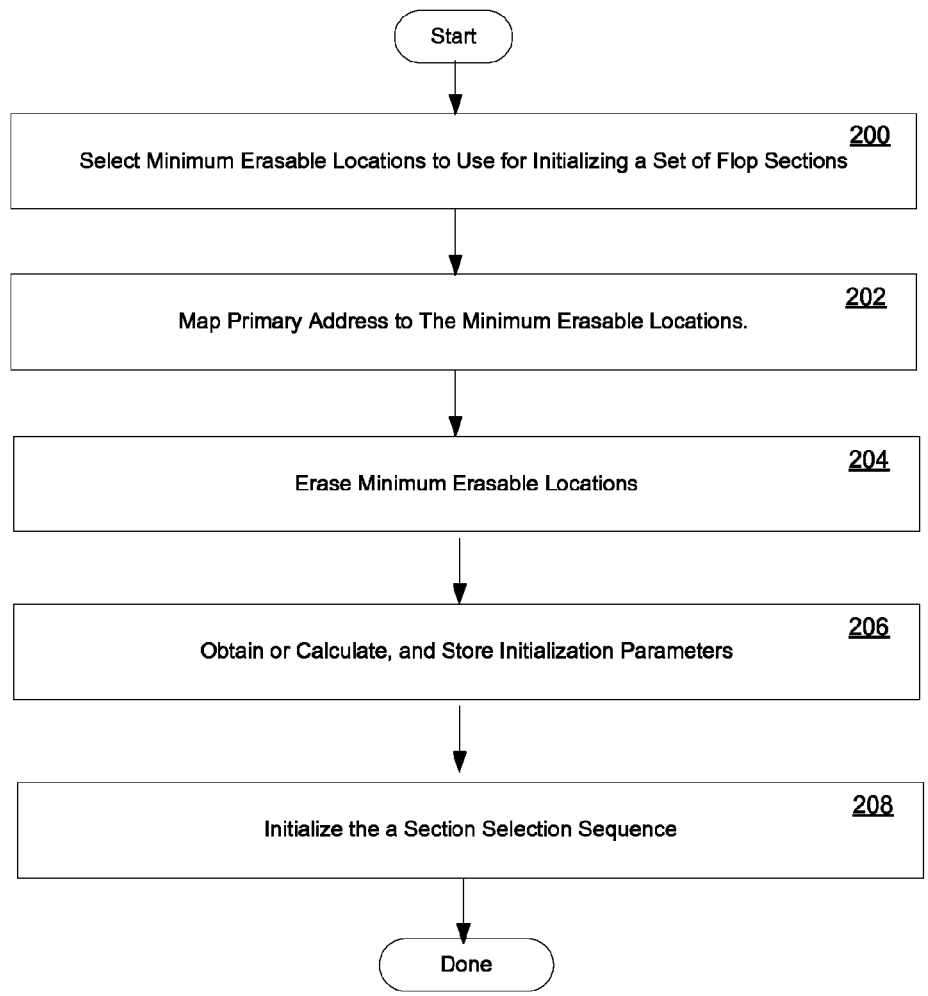
FIG. 6 illustrates a method of initializing a flop for minimizing erase cycles in an electronic storage device that uses at least one erase-limited memory device in accordance with yet another embodiment of the present invention.

FIG. 6 illustrates a method of initializing a flop for minimizing erase cycles in an electronic storage device that uses at least one erase-limited memory device in accordance with yet another embodiment of the present invention. Initializing a flop may be required when electronic device is used for the first time. The method in FIG. 6 is further described below with reference to FIGS. 1, 2 and 5A.

A set of at least one minimum erasable locations that will be used to initialize a flop is selected 200. For example, flash blocks 52-1 through 52-n,in flash memory device 14-2 may be used to provide this set of minimum erasable locations. Flash blocks 52-1 through 52-n are referred to as flop blocks in FIG. 5A to indicate that a flop has been initialized using these flash blocks.

A primary address is mapped 202 to these minimum erasable locations. For example, an LBA used by host 30 is mapped to the addresses of flash blocks 52-1 through 52-n in flash memory device 14-2 by using mapping table 22. The addresses of flash blocks 52-1 through 52-n may be in the form of physical block addresses, such as PBA 2-1, PBA 2-2, and PBA 2-n.

These minimum erasable locations are erased 204 by storage processing system 16 as directed by program code 26. Erasing a minimum erasable location in a flop may also be referred to as initializing a flop block.

Initialization parameters are obtained or calculated, and then stored 206 into non-volatile memory, such as in a flash memory device. These parameters include: the size of a minimum erasable location, the size of the minimum writeable location that will be used as a flop section; the number of flop sections per minimum erasable location; the number of erasable locations mapped to the primary address in step 202; a sequence range; and an invalid flop section location.

The size of a minimum erasable location in this example is the size of flash block 52-1. In the embodiment shown, flash blocks that are used as minimum erasable locations are of the same size, and flash block 52-1 may be disposed with a block size of 256 KB.

The size of the minimum writeable location in this example is a flash block page. Although not intended to be limiting in any way, blocks 52-1 through 52-n are each disposed to have the same page size, such as 2 KB, and thus the flop sections initialized in this method each have a flop section size of 2 KB.

The number of flop sections per minimum erasable location may be calculated by dividing the size of the minimum erasable location used by the flop section size. In this example, the number of flop sections is equal to the flash block size of 256 KB divided by the flop section size of 2 KB.

The number of erasable locations mapped to the primary address in step 202 is equal to the number of flash block addresses mapped to the primary address in step 202, which is equal to n in this example.

Figures 4, 5A:
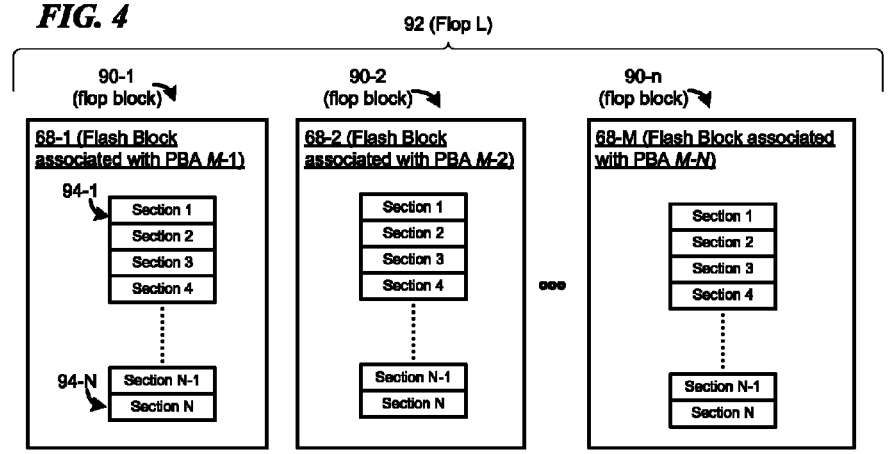
FIG. 4 illustrates an example flop having one or more flop blocks in accordance with another embodiment of the present invention.
FIG. 5A illustrates the flop section states of a flop immediately after the initialization of a flop in accordance with yet another embodiment of the present invention.

The sequence range is a range of values, such as ascending numbers, that can be used to identify the relative position of a flop section in a flop according to the section selection sequence used. For instance, if this section selection sequence selects flop sections on per block basis, the beginning sequence value selected for this sequence range can be set to zero (0) and the ending sequence value selected for this sequence range can be set to the number of flop sections per minimum erasable location multiplied by the number of minimum erasable locations in the flop minus one (1). In FIG. 5A, flop block 56 illustrates a total of (n*z)−1 erased flop sections.

A flop section location is used to point to a specific flop section within a flop. A flop section location includes two values, a flop block index and a flop section index. The flop block index reflects the relative position of a minimum erasable location within the set of minimum erasable locations, and is unique to the particular memory device that contains the minimum erasable location referenced by the minimum erasable identifier. A flash block index is unique to a particular erase-cycle memory device within the flop. For example, referring FIG. 5B, flop blocks 52-1 through 52-n, which are implemented in the form of flash blocks having PBA 2-1 through PBA2-n in FIG. 2, can be described to have the relative positions of 0, 1,through n−1, respectively. The flop section index reflects the relative position of a flop section within the set of flop sections in a minimum erasable location and is unique to the particular flop section within the minimum erasable location. Flop sections 104-1, 104-2 through 104-z can be described to have a flop section index of 0, 1,through z−1,respectively. Flop section 104-1, therefore, has a flop section location of 00. An invalid flop section location is a predefined flop section location value that does not point to a particular flop section within a flop. In the example in FIG. 5B, the value represented by the variables nz is used to represent the invalid flop section location although this value is not intended to limit the present invention in any way.

A section selection sequence is initialized in step 208 and the first minimum writeable location in an erased minimum erasable location in the section selection sequence is treated as an available flop section by storing the location of this available flop section in working memory. Consequently, if the section selection sequence treats flop section 104-1 in flop block 52-1, as an available flop section, storage processing system stores the values 00 in working memory as an available flop section location 106. Storage processing system 16 in FIG. 1, also stores the invalid flop section location value in working memory as a valid flop section location 108. During succeeding boot-ups of electronics storage device 10, the available flop section location and valid section location are initialized to contain the invalid flop section location value. An available flop section location is intended to hold a value that represents the next erased flop section location in the section selection sequence that can receive a write operation to store data associated with the primary address mapped to flop 56.

Section Selection Sequence and Offsets

In accordance with another embodiment of the present invention, each flop section is addressable by using an offset from the address of the flop block which has been initialized to include the flop section. For example in from FIG. 4 flop blocks 90-1 through 90-n may be disposed to be in the form of flop L, and thus, these flop blocks are respectively associated with PBA addresses M-1, M-2, M-N which in turn are associated with flash blocks 68-1, 68-2 through 68-M. The means for minimizing erase cycles, such as storage processing system 16 executing program code 26 in FIG. 1, uses an offset value that points to the beginning boundary of a flop section within each flop.

For example since in FIG. 4, flop blocks 90-1 through 90-n are in the form of flash blocks, and if the minimum writable area selected is a page, then storage processing system 16 would use an offset value that when combined with the address of a flop block, named "flop block address", would point to the beginning page boundary of a page. The flop block address in the example in FIG. 4 is equal to the address of the flash block from which a flop block is formed. For example, flop block 90-1 would have a flop block address equal to the PBA of flash block 68-1, which is PBA M-1 in FIG. 4. The offset value selected is not limited to point to page boundaries but could be used to point within a page, such as when using partial pages as flop sections.

Figure 5B:
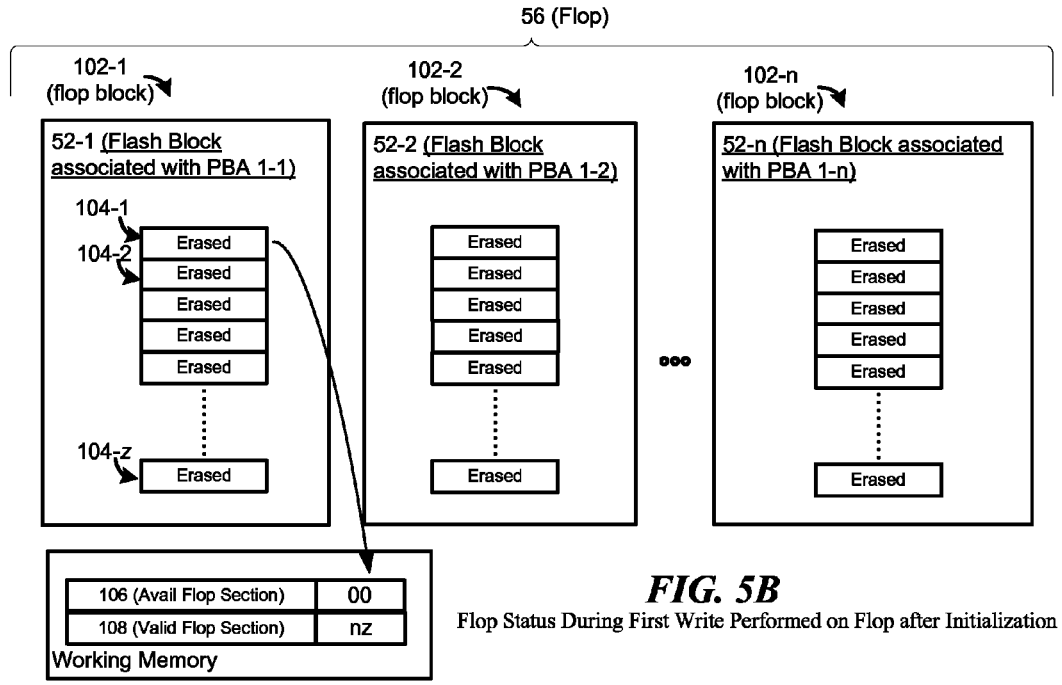
FIG. 5B illustrates the flop section states of a flop during a first flop write memory operation that pertains to a primary address that has been mapped to a flop having initialized flop sections in accordance with yet another embodiment of the present invention.

The use of offset values combined with a flop block address to point to flop sections in a flop block is not intended to limit the present invention in any way but any method may be used to permit a storage processing system, such as storage processing system 16 in FIG. 1, to access a flop section partitioned within a flop block, such as flop block 104-1 through 104-z in FIG. 5B. For instance, if storage processing system 16 receives a memory transaction request for data with a primary address that is mapped to a flop through mapping table 22, storage processing system 16 selects a flop section from the flop according to a chosen section selection sequence. If this flop has not been mapped to any minimum erasable locations, storage processing system 16 initializes the flop as discussed earlier with reference with FIG. 5A. After initialization, storage processing system 16 selects flop sections sequentially according to this section selection sequence. Each used flop section may then be reused after their flop block is re-initialized, rendering the newly initialized or created flop sections to be selected and used once again.

After flop initialization, storage processing system 16 under program code 22 uses this section selection sequence to find certain flop sections. For write operations that involve a flop, storage processing system 16 searches for an available flop section. An available flop section is a flop section that has been initialized but has not yet been used to store data. Storage processing system 16 may only use an available flop section once to store data until the flop block for this flop section is initialized again. For read operations that involve a flop, storage processing system 16 searches for a valid flop section. A valid flop section is a flop section that holds the most current data in the set of flop section in the same flop. Since a flop has more than one flop section, data from the same primary address is written only to an available flop section. There is only one available flop section and only one valid flop section per flop. Storage processing system 16 keeps a record of the location of the available flop section and the location of valid flop section by storing these locations in working memory as further described herein.

The section selection sequence used may be any sequence suitable for sequentially accessing initialized flop sections, and the following section selection sequence examples below are not intended to limit the present invention in any way. For example, storage processing system 16 may be disposed to select flop sections only from the same flop block in a flop having more than two flop blocks. Flop sections from another flop block within the same flop are not selected until all erased flop sections from the prior used flop block have been used. With reference to FIGS. 1 and 4, under this example of a section selection sequence, storage processing system 16 selects the first flop section 94-1, named "section 1", in flop block 90-1, then the second flop section 94-2, named "section 2", in flop block 90-1, and so on until the flop section sought by storage processing system 16 is found. In a write operation, storage processing system 16 only uses flop sections from another flop block in flop 92, such as flop block 90-2, if all flop sections in flop block 90-1 have been used and no flop sections in flop block 90-1 are available to store data. In effect, flop sections are selected sequentially per flop block under this section selection sequence.

Storage processing system 16 can obtain the flop block address of flop block 90-1 from the mapping structure that provides the mapping of primary addresses with flops, such as mapping table 22 in FIG. 1. Storage processing system 16 uses successive offsets beginning from the flop block address provided by a primary address to flop mapping table, such as mapping table 22 in FIG. 4, to sequentially access another available flop section until flop sections have been accessed in the flop block.

After all flop sections in flop block 90-1 have been used and no other flop sections are available in flop block 90-1, storage processing system 16 selects another flop section, if available, by using the next flop address that is associated with another flop block in flop 92 in mapping table 22. For instance, storage processing system 16 selects flop section 1 from flop block 90-2 by using its flop block address, and then sequences down to each section in flop block 90-2 by using an offset value. This continues, until all available flop sections in flop block 90-2 have been used, and if so, storage processing selects sections from flop block 90-n by using this selection sequence until all available flop sections in flop 92 have been used. After all flops sections have been used for each flop block in flop 92, storage processing system 16 re-initializes the flop blocks in flop 92 again in the same manner.

In another example of a section selection sequence, storage processing system 16 may instead select an available flop section from a first flop block and in a subsequent selection selects an available flop section only from flop blocks that were not selected in a prior selection of an available flop section and that are from the same flop. Only after storage processing system 16 has selected one available flop section from each of these flop blocks from the same flop, can storage processing system 16 again select another available flop section from the same flop block used previously.

With reference again to FIG. 4, under this example of a section selection sequence, storage processing system 16 selects the first flop section 1 in flop block 90-1, then flop section 1 in flop block 90-2, and so on until there are no other flop blocks available in flop 92 that were not used in a prior selection of an available flop section. Any subsequent section selection sequence is made from a flop block that is different from the flop block used in the prior section selection sequence until all flop blocks have been used to provide a flop section under the section selection sequence. When each flop block, such as flop blocks 90-1 through 90-n, have been used in the section selection sequence, storage processing system 16 returns to flop block 90-1 and selects flop section 2, and in another write cycle, selects flop section 2 from flop block 90-2 and so on until all flop blocks have been again used to provide a flop section under the section selection sequence. In effect, flop sections are selected under this section selection sequence across flop blocks from the same flop. The algorithm used by storage processing system 16 under this section selection sequence may include using the first flop block address listed in mapping table 22 that is mapped to the primary address associated with the data that will be written into an available flop section that is selected under the section selection sequence.

After initializing at least one flop so that the flop can be used to minimize erase cycles in erase-limited memory devices, storage processing system 16 tracks which flop blocks can be erased and which flop sections are available to receive data. Flop sections available to receive data may herein also be referred to as "available flop sections." In accordance with one embodiment of the present invention, storage processing system 16 uses a set of sequence numbers that is comprised of sequential numbers that are unique with respect to each other. Storage processing system 16 stores one of these sequence numbers with each data that is subject to a write transaction, such as data having primary address 62-1 in FIG. 2, when storing the data into an available flop section. The amount of sequence numbers in this set of sequence numbers is equal to the number of flop sections initialized in a flop, such as flop 56 in FIGS. 5A-5D, and no two sequence numbers are the same in the same flop. For example, if flop 56 has been initialized to include flop sections 104-1 through 104-z, and each flop block contains z number of flop sections, the set of sequence numbers would include n*z numbers that are in sequence, where z represents an arbitrary number. Integer numbers may be used in the set of sequence numbers, in the example set of sequence numbers example immediate above, can range from 0 through ((n*z)−1).

Before a flop can be used to minimize erase cycles, storage processing system 16 creates a flop by mapping the respective flop block address of flop blocks that will comprise the flop to a primary address. For example, referring again to FIGS. 2 and 5A-5D, storage processing system 16 maps primary address 62-2 to the addresses of flash blocks 52-1 through 52-n of flop 56. At least one of these flop blocks, such as flop blocks 102-1 through 102-n, that is mapped to the primary address 62-2 is then erased by storage processing system 16 to initialize flop sections in flop 56.

Figure 5C:
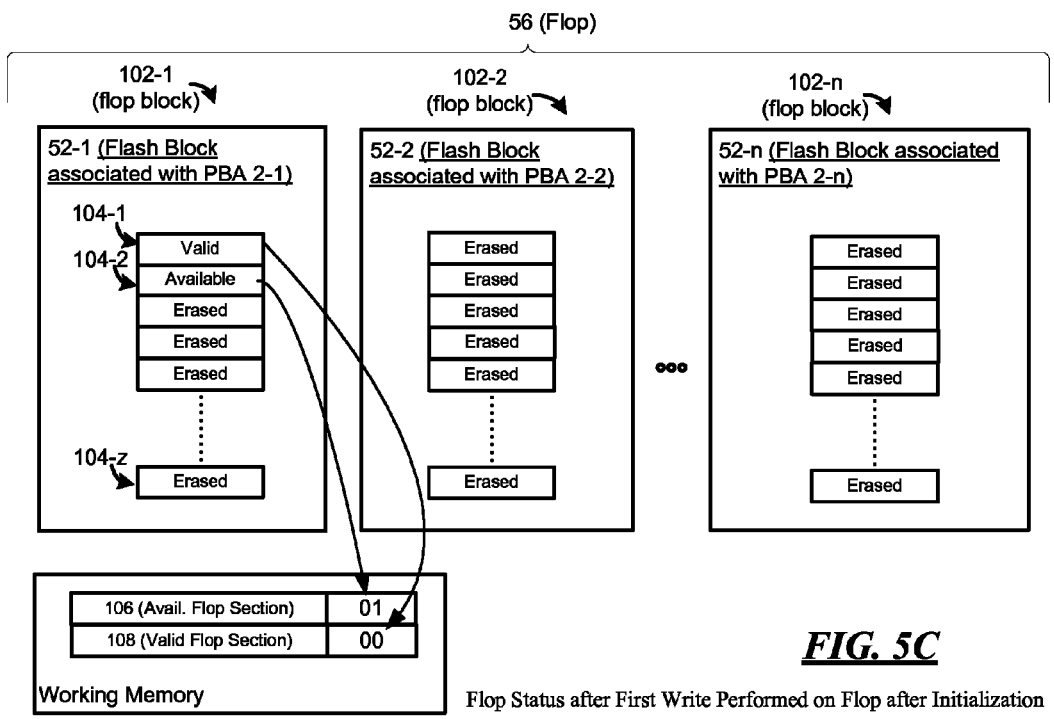
FIG. 5C illustrates the flop section states of a flop after a first flop write in accordance with yet another embodiment of the present invention.

For the first write operation that is performed after initialization of the flop sections and that pertains to data associated with primary address 62-2, storage processing system 16 selects the first available flop section, such as flop section 104-1 in FIG. 5B, according to the section selection sequence used. After selecting the first available flop section, storage processing system 16 writes this data in flop section 104-1, and records the location of flop section 104-1 in the working memory as the valid flop section location 108 as illustrated in FIG. 5C. Storage processing system 16 also embeds the first number in a set of sequence numbers with this data in flop section 104-1; and updates available flop section location 106 to reflect the location of the next erased flop section under the section selection sequence used and that can be used to receive data in a subsequent write operation involving primary address 62-2. For example in FIG. 5C, the next available flop section that reflects the location of the next flop section under the section selection sequence is flop section 104-2 and its location of 01 is stored in available flop section location 106 in working memory.

Figure 5D:
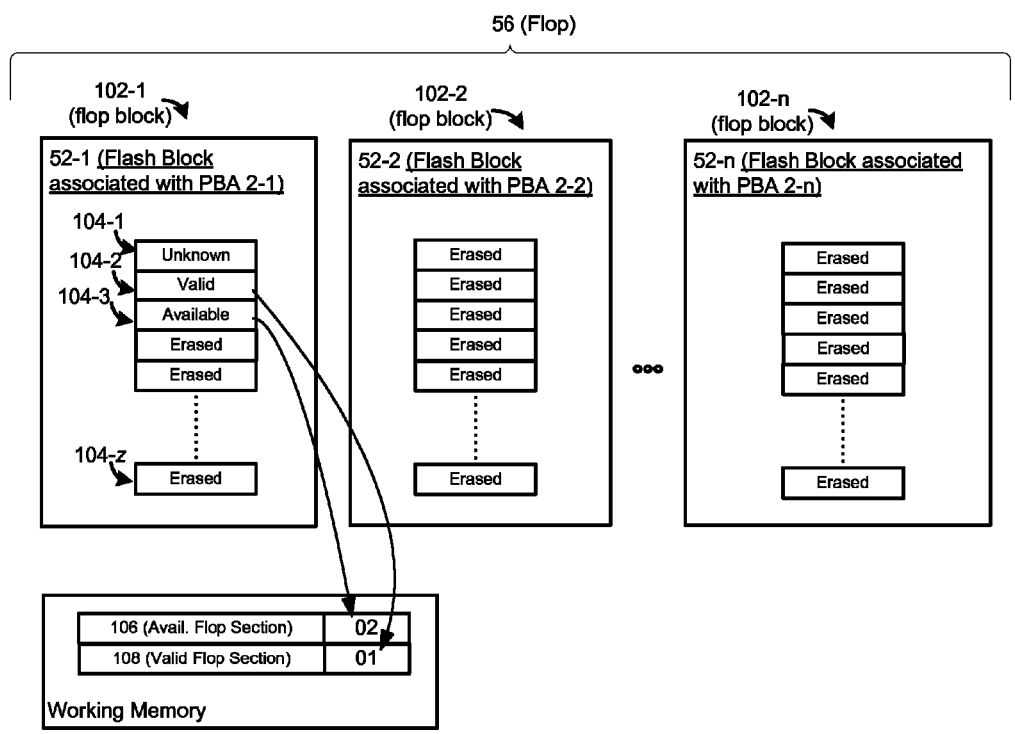
FIG. 5D illustrates the flop section states of a flop after a second flop write in accordance with yet another embodiment of the present invention.

FIG. 5D illustrates the states of flop sections in a flop block, such as flop block 102-1, after a storage processing system performs the second write operation on flop block 102-1 in accordance with yet another embodiment of the present invention. For the second write operation that is performed for data associated with primary address 62-2, storage processing system 16 selects the first available flop section, which is now flop section 104-2 in FIG. 5C, in flop 56 according to the section selection sequence used. After selecting the first available flop section, storage processing system 16 writes this data in flop section 104-2, and records the location of flop section 104-2 in the working memory as the valid flop section location 108 as illustrated in FIG. 5D. Since 104-1 is no longer in the erased state and neither the available flop section location nor the valid flop section location point flop section 104-1, flop section 104-1 can be described as "unknown" since cannot be used by storage system processing to read or write data until the flop sections in flop block 102-1 are initialized again. This "unknown" state is not recorded by storage processing system 16 in the embodiment shown.

Storage processing system 16 also embeds the second number in a set of sequence numbers with this data in flop section 104-2; and updates available flop section location 106 to reflect the location of the next erased flop section under the section selection sequence used and that can be used to receive data in a subsequent write operation involving primary address 62-2. For example in FIG. 5D, the next available flop section that reflects the location of the next flop section under the section selection sequence is flop section 104-3 and its location of 02 is stored in available flop section location 106 in working memory.

Figure 7:
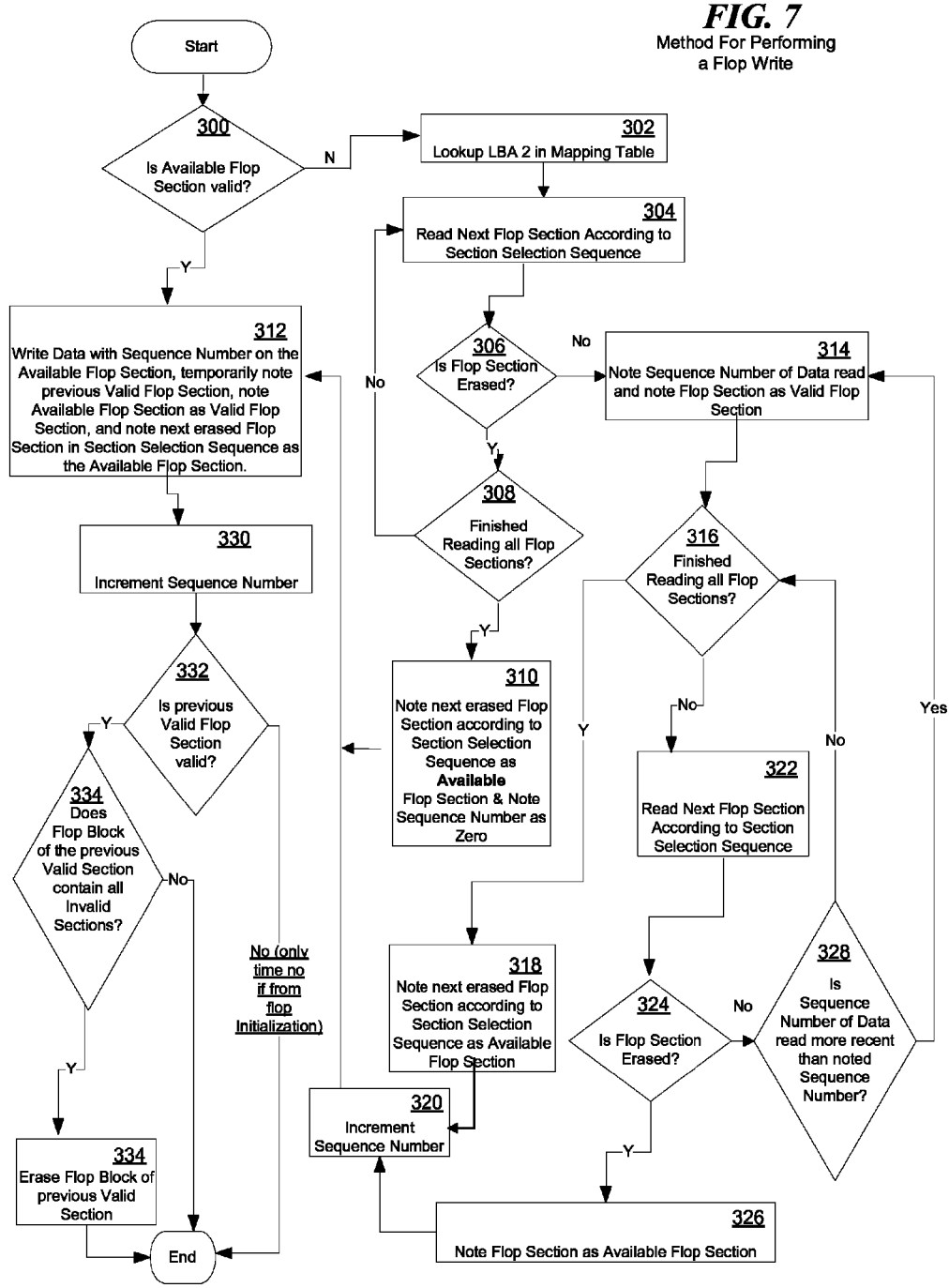
FIG. 7 illustrates a method of performing a flop write operation in an electronic storage device that minimizes erase cycles in at least one erase-limited memory device in accordance with yet another embodiment of the present invention.

FIG. 7 illustrates a method of performing a write operation in an electronic storage device that minimizes erase cycles in at least one erase-limited memory device, named "flop write operation", in accordance with yet another embodiment of the present invention. The method in FIG. 7 is further described below with reference to FIGS. 1 and 2 and is performed after a set of flop sections have been initialized, such as by the flop section initialization method disclosed above with reference to FIG. 6 above.

Upon receiving a memory transaction 28 from host 30 through IO interface 18, electronic storage device 10 through storage processing system 16 will determine whether the memory transaction 28 pertains to a read or write memory operation involving a primary address, such as a LBA 62-2 (LBA 2). If memory transaction 28 pertains to a write operation, the method in FIG. 7 is performed.

At 300, it is determined whether the available flop section location in working memory for flop 56 is valid. Determining whether the available flop section location is valid may include comparing the available flop section location value stored in working memory to the value stored in working memory that represents the invalid flop section location. If these values are the same then the available flop section location is not valid.

If yes, the process flow proceeds to step 312. If no, mapping table 22 is searched 302 for LBA 62-2. A flop section that has been initialized from one of the flash blocks mapped to LBA 62-2 is read 304 according to a section selection sequence. In this example, the section selection sequence sequentially selects flop sections in the same flash block before selecting another flop section in another flash block and keeps track of the number of flop sections read.

It is determined 306 whether the currently read flop section is erased.

If yes, it is determined 308 whether all flop sections have been read under the section selection sequence. In this example, storage processing system 16 determines whether all flop sections have been read in the flop by dividing the maximum erasable location size with the minimum writable location size and multiplying the quotient by the number of flop blocks in the flop. A result that is equal to the current number of flop sections read indicates that storage processing system has reach the end of the flop. If yes, the process flow proceeds to step 310.

At step 310, the location of the next erased flop section is stored as the available flop section location in working memory. In this example, the next erased flop section location is the erased flop section location that is subsequent to the first erased flop section under the section selection sequence used, such as flop section 104-1. In one embodiment of the present invention, the information stored in working memory as a flop section location includes two values, a flop block index and a flop section index. Consequently, the next available flop section location reflects the flop block index and the flop section index of the available flop section location found in step 310. In addition, the first sequence number in the sequence range, which can be previously calculated and stored in non-volatile memory during the initialization of the flop, is stored in working memory as the current sequence number. The process flow then leads to step 312.

If at step 308, it is determined that not all flop section have been read under the section selection sequence, the program flow returns to step 304, and the next flop section under the section selection sequence is read.

If at step 306, it is determined that the currently read flop section is not erased, the sequence number stored with the data in the currently read flop section and the flop section location of the currently read flop section are stored 314 as the current sequence number and the valid flop section location respectively in working memory.

At step 316, it is determined whether all flop sections have been read under the section selection sequence.

If yes, the location of the next erased flop section in the section selection sequence is stored 318 in working memory as the available flop section location. This process flow then proceeds to step 320, where the current sequence number that is currently stored in working memory is incremented. The process flow then proceeds to step 312.

If at step 316 not all of the flop sections have been read in the flop, the next flop section in the section selection sequence is read 322.

At step 324, it is determined whether next flop section read in step 322 is erased, and if so, the location of next flop section in the section selection sequence is stored 326 as the available flop section location in working memory. The program flow then proceeds to step 320.

If at step 324, the next flop section read in step is not erased; it is determined 328 whether the sequence number read from the next flop section read in step 322 is more recent than the current sequence number stored in working memory.

If no, then the process flow proceeds to step 316, and if yes, then the process flow proceeds to step 314.

At step 312, the data associated with the primary address, such as LBA 2, that is subject to the memory write transaction request; is written to the flop section corresponding to the available flop section location stored in working memory. In addition, the current sequence number, such as the current sequence number stored in working memory is also stored in the same flop section as the data. Further, the previous valid flop section location is temporarily stored in working memory, the available flop section location is stored as the valid flop section location in working memory, and the next erased flop section in the section selection sequence is noted by storing the location of this next erased flop section as the available flop section location in working memory.

At step 330, the current sequence number is incremented.

At step 332, it is determined whether the previous valid flop section location temporarily stored in working memory is valid. A previous valid flop section is valid if the write memory operation is at least the second subsequent write memory operation performed after initialization of the flop. Consequently, in the example in FIG. 2, the only time the previous valid flop section location is not valid occurs immediately after the initialization of flop 56.

If a previous valid flop section is not valid, the process flow completes and exits.

If a previous valid flop section is valid, the process flow continues to step 334, where it is determined 334 whether the flop block of the previous valid flop section contains only invalid flop sections. This may be performed by determining whether the valid flop section location contains a value that now points to a flop block that is different than the flop block pointed to by the previous valid flop section location value.

At step 344, the flop block of the previous valid flop section is erased and the process flow can then terminate.

Figure 8:
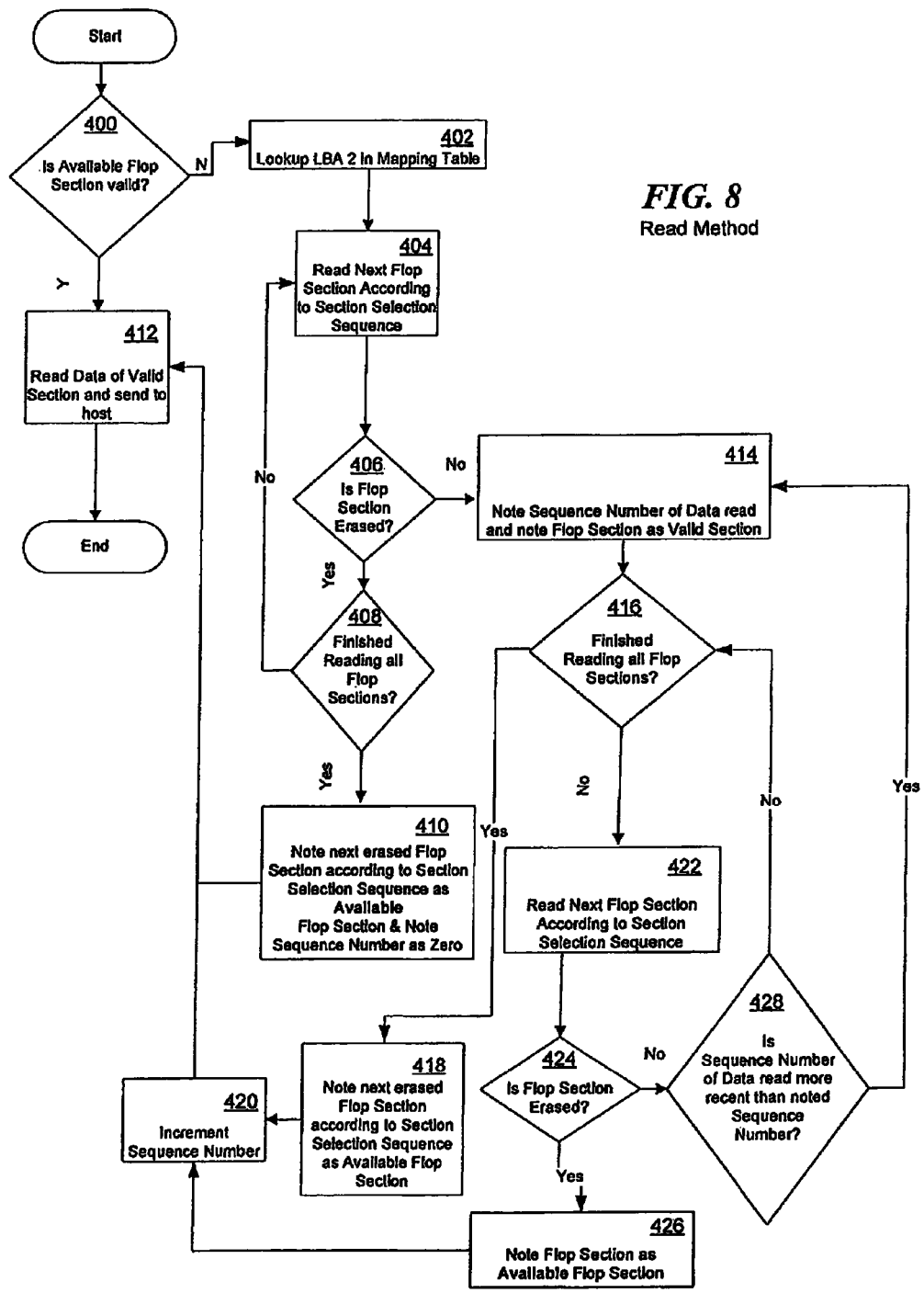
FIG. 8 illustrates a method of performing a flop read operation in an electronic storage device that minimizes erase cycles in at least one erase-limited memory device in accordance with yet another embodiment of the present invention.

FIG. 8 illustrates a method of performing a read operation in an electronic storage device that minimizes erase cycles in at least one erase-limited memory device, named "flop read operation", in accordance with yet another embodiment of the present invention. The method in FIG. 8 is further described below with reference to FIGS. 1 and 2 and is performed after a set of flop sections have been initialized, such as by the flop section initialization method disclosed above with reference to FIG. 6 above.

Upon receiving a memory transaction 28 from host 30 through IO interface 18, electronic storage device 10 through storage processing system 16 will determine whether the memory transaction 28 pertains to a read or write memory operation involving a primary address, such as a LBA 62-2. If memory transaction 28 pertains to a read operation, the method in FIG. 8 is performed.

At 400, it is determined whether the available flop section location stored in working memory for flop 56 is valid. Determining whether this flop section location is valid may include comparing the available flop section location value to the stored invalid flop section location value. If these values are not equal then the available flop section location value in working memory is valid.

If yes, the process flows to step 312. If no, mapping table 22 is searched 402 for LBA 62-2. A flop section that has been initialized from one of the flash blocks mapped to LBA 62-2 is read 404 according to a section selection sequence. In this example, the section selection sequence sequentially selects all flop sections in the same flash block before selecting another flop section in another flash block.

It is determined 406 whether currently read flop section is erased.

If yes, it is determined 408 whether all flop sections have been read under the section selection sequence.

At step 410, if all flop sections have been read, the location of the next erased flop section is stored as the available flop section location in working memory. In addition, the first sequence number in the sequence range, which can be previously calculated and stored in non-volatile memory during the initialization of the flop, is stored in working memory as the current sequence number. The process flow then leads to step 412.

If at step 408, it is determined that not all flop section have been read under the section selection sequence, the program flow returns to step 404, and the next flop section under the section selection sequence is read.

If at step 406, it is determined that the currently read flop section is not erased, the sequence number stored with the data in the currently read flop section and the flop section location of the currently read flop section are stored 414 as the current sequence number and the valid flop section location respectively in working memory.

At step 416, it is determined whether all flop sections have been read under the section selection sequence.

If yes, the location of the next erased flop section in the section selection sequence is stored 418 in working memory as the available flop section location. This process flow then proceeds to step 420, where the current sequence number that is currently stored in working memory is incremented. The process flow then proceeds to step 412.

If at step 416 not all of the flop sections have been read in the flop, the next flop section in the section selection sequence is read 422.

At step 424, it is determined whether next flop section read in step 422 is erased, and if so, the location of next flop section in the section selection sequence is stored 426 as the available flop section location in working memory. The program flow then proceeds to step 420.

If at step 424, the next flop section read in step is not erased; it is determined 428 whether the sequence number read from the next flop section read in step 422 is more recent than the current sequence number stored in working memory.

If no, then the process flow proceeds to step 416, and if yes, then the process flow proceeds to step 414.

At step 412, data stored in the flop section corresponding to the valid flop section location stored in working memory is read and sent to the host. The process flow can then terminate.

Figure 9:
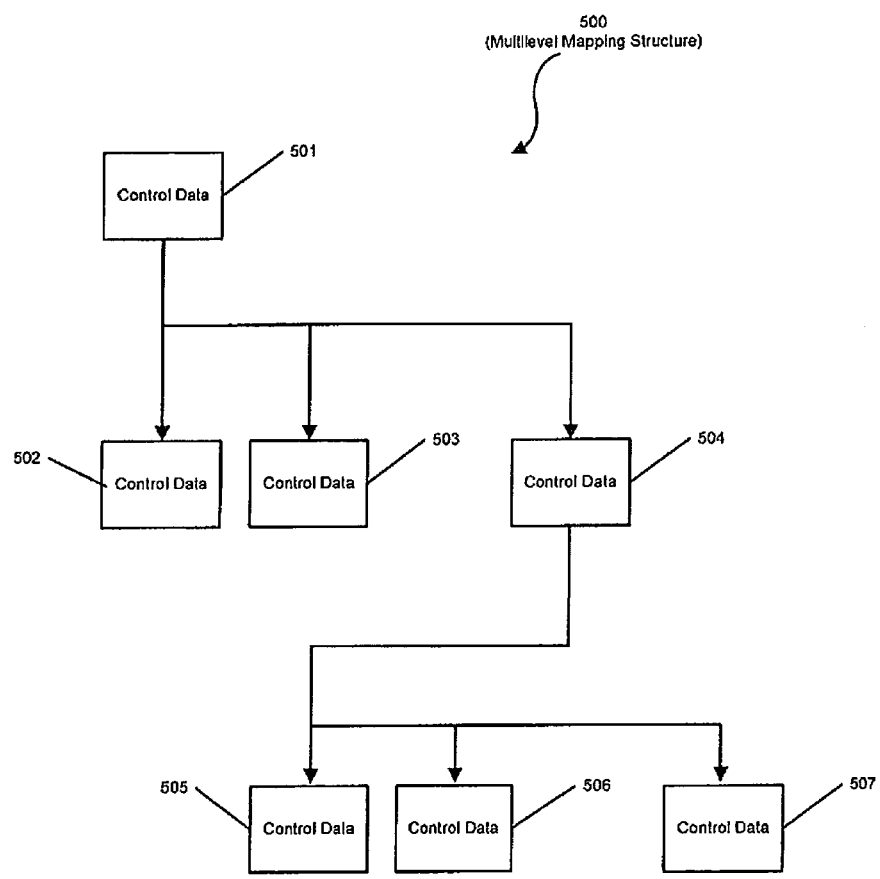
FIG. 9 illustrates a multilevel structure that may be used with the invention in accordance with yet another embodiment of the present invention.

FIG. 9 illustrates a multilevel structure 500 that may be used with the present invention. Multilevel structure 500 may be written in an erase-limited memory device, such as flash memory device 14-1 in FIG. 1. Multilevel structure 500 includes control data 501 stored at the top level, sometimes referred to as the root node, of the multilevel structure 500. The contents of control data 501 include the physical locations of control data at level below the top-most level, such as second control data 502, 503, and 504. Control data 501 may be referred to as the parent of 504, and 504 is a child of control data 501. Similarly, control data 504 is the parent of control data 505, and control data 505 is a child of 504. A parent can have multiple children but a child can only have one parent.

When a child changes its physical location, its parent will incur a change in content and will have to be written to the target flash memory device storing the parent. In an implementation where every write to the flash memory device requires a change in physical location, such as in pre-erase memory addressing, a change in any level below the top level in the multilevel structure, such as control data 507 will cause a change to its parent, such as control data 504 which will in turn cause a change to its parent, such as 501. This domino effect flows from changes incurred from a lower level to a higher level, resulting in a change in control data at the top level any time a change occurs at any of the lower levels of multilevel structure 500. When using a flop in a multilevel structure 500, the parent mapped to the flop will not incur the domino effect since the parent will only need to store the address of the flop, and thus, the parent will not incur a change if the location of any of its children changes For example, referring to FIGS. 1 and 2, if the parent is in the form of control data 501 and control data 501 is mapped to flop 46, any changes to control data that are children to control data 501 will be written to flop sections of flop 46 and erase-cycles will be delayed until a flop block is re-initialized, reducing or minimizing erase cycles in flash block 46.

While the present invention has been described in particular embodiments, it should be appreciated that the present invention should not be construed as limited by such embodiments. Rather, the present invention should be construed according to the claims below.

We claim:

1. An electronic storage device-enabled method of reducing erase cycles in an electronic storage device that uses non-volatile solid-state memory devices, including erase-limited memory devices that each include a plurality of non-volatile memory cells, the method comprising:
   creating a logical storage unit in one of the non-volatile memory cell, the logical storage unit comprising a first flop that includes at least one flop section, including a first flop section and a second flop section;
   wherein the non-volatile solid-state memory devices are configured to reduce erase cycles;
   mapping a first address to said first flop;
   reading said flop sections from said first flop using a section selection sequence;
   storing data associated with said first address in said first flop by writing said data into said first flop section and storing a first value representing said first flop section location into a valid flop section location;
   if said data is changed, storing said changed data into said second flop section, assigning said first flop section with an invalid status, storing said changed data in said second flop section, and assigning a valid status to said changed data; and
   limiting said data to have a data size that is no more than the flop section size of said at least one flop section.

2. The method of claim 1, wherein said creating a first flop further includes:
   erasing a first non-volatile memory cell associated with a first non-volatile solid-state memory device;
   associating said first non-volatile memory cell to said first address; and
   partitioning said first non-volatile memory cell into said first flop section and said second flop section.

3. The method of claim 1, wherein said creating a first flop further includes:
   erasing a first non-volatile memory cell and a second non-volatile memory cell that are associated with a first non-volatile solid state memory device;
   associating said first and second cells to said first address; and
   partitioning said first block into at least said first flop section and said second block into at least said second flop section.

4. The method of claim 1, wherein said creating a first flop further includes erasing a first non-volatile memory cell that is associated with a first non-volatile solid-state memory device.

5. The method of claim 4, wherein said first flop section includes a flop section size that is equal to the size of a minimum writable location defined for said first cell.

6. The method of claim 5, wherein said minimum writable location is a partial page of said first cell.

7. The method of claim 5, wherein said minimum writable location is a page of said first cell.

8. An apparatus comprising:
   a storage device comprising a memory store that includes at least one non-volatile solid-state memory device, wherein the at least one non-volatile solid-state memory device is an erase-limited memory device;
   wherein the at least one non-volatile solid-state memory device comprises at least one logical storage unit comprising a flop;
   wherein the flop comprises a first flop section and second flop section;
   wherein a first address is mapped to a first flop, a flop block is erased, and a plurality of flop sections are created from the first flop block; and
   wherein write operations of data associated with the first address is limited to only a flop section that has not been previously used to store said data after initialization of said first flop.

9. The apparatus of claim 8, .wherein said first flop block is re-initialized after all flop sections associated with the first flop block have been used in the write operations.

10. The apparatus of claim 8, wherein the first flop section and the second flop section are included in a first cell from the non-volatile memory cells in a non-volatile solid-state memory device.

11. The apparatus of claim 8, where the first flop section is a first cell from the non-volatile memory cells and the second flop section is in a second cell from the non-volatile memory cells in a non-volatile solid-state memory device.

12. The apparatus of claim 8, where the first flop section is a first non-volatile memory cell in a first non-volatile solid-state memory device, and the second flop section is in a second non-volatile memory cell in a second non-volatile solid state memory device.

13. The apparatus of claim 8, further comprising: a mapping structure for mapping a primary address to a set of at least one non-volatile memory cell, wherein the primary address is associated with data which is subject to the memory transaction request.

14. The apparatus of claim 13, wherein the primary address comprises a logical block address and wherein the set of at least one non-volatile memory cell corresponds to a set of physical block addresses.

15. An electronic storage device-enabled method of initializing a logical storage unit for minimizing erase cycles in an electronic storage device, comprising:
   selecting minimum erasable locations that will be used to initialize the logical storage unit, wherein the locations comprises non-volatile memory cells;
   mapping a primary address to the minimum erasable locations;
   erasing the minimum erasable locations in a logical storage unit in order to initialize a non-volatile memory cell;
   calculating or obtaining initialization parameters, and storing the initialization parameters; and initializing a section selection sequence, wherein a first minimum writeable location in an erased minimum erasable location in the section selection sequence is treated as an available flop section.

16. The method of claim 15, wherein a size of one of the minimum erasable location is a page.

17. A computer program product comprising a non-transitory computer usable medium having control logic stored therein for causing a computer to facilitate in initializing a logical storage unit for minimizing erase cycles in an electronic storage device, said control logic comprising:
 selecting minimum erasable locations that will be used to initialize the logical storage unit, wherein the locations comprises non-volatile memory cells;
 mapping a primary address to the minimum erasable locations;
 erasing the minimum erasable locations in a logical storage unit in order to initialize a non-volatile memory cell;
 calculating or obtaining initialization parameters, and storing the initialization parameters; and
 initializing a section selection sequence, wherein a first minimum writeable location in an erased minimum erasable location in the section selection sequence is treated as an available flop section.

18. The computer program product of claim 17, wherein a size of one of the minimum erasable location is a page.

19. An electronic storage device-enabled method for reducing erase cycles in an electronic storage device, the method comprising:
 initializing a first logical storage unit in a memory device by at least mapping a first address to the first logical storage unit, erasing a first logical storage unit block, and creating a plurality of logical storage unit sections from said first logical storage unit block; and
 limiting memory device write operations of data associated with the first address to only a logical storage unit section that has not been previously used to store the data after initialization of the first logical storage unit.

20. The method of claim 19, further comprising:
 re-initializing said first logical storage unit block after all of said plurality of logical storage unit sections from said first logical storage unit block have been used in said write operations.

21. The method of claim 19, further including:
 using a mapping structure and a pointer to point said first address to a second address; and
 using said pointer as said data.

22. The method of claim 19, further comprising:
 using a host address as said first address, and a local address as said second address.

23. A computer program product comprising a non-transitory computer usable medium having control logic stored therein for causing a computer to facilitate in reducing erase cycles in an electronic storage device, said control logic comprising:
 initializing a first logical storage unit in a memory device by at least mapping a first address to the first logical storage unit, erasing a first logical storage unit block, and creating a plurality of logical storage unit sections from said first logical storage unit block; and
 limiting memory device write operations of data associated with the first address to only a logical storage unit section that has not been previously used to store the data after initialization of the first logical storage unit.

24. The computer program product of claim 23, wherein said control logic further comprises:
 re-initializing said first logical storage unit block after all of said plurality of logical storage unit sections from said first logical storage unit block have been used in said write operations.

* * * * *